United States Patent [19]
Saito et al.

[11] Patent Number: 5,587,205
[45] Date of Patent: Dec. 24, 1996

[54] PLASMA PROCESSING METHOD AND AN APPARATUS FOR CARRYING OUT THE SAME

[75] Inventors: Hiroshi Saito, Fujisawa; Yasumichi Suzuki, Yokohama; Naoyuki Tamura, Kudamatsu, all of Japan

[73] Assignee: Hitachi, Ltd., Tokyo, Japan

[21] Appl. No.: 172,285

[22] Filed: Dec. 23, 1993

[30] Foreign Application Priority Data

Dec. 28, 1992 [JP] Japan ................................. 4-347682
Dec. 28, 1992 [JP] Japan ................................. 4-347683
Dec. 10, 1993 [JP] Japan ................................. 5-310100

[51] Int. Cl.⁶ .......................... B05D 3/06; C23C 16/00; H01L 21/00
[52] U.S. Cl. .................... 427/553; 427/595; 156/345; 156/643.1; 156/646.1; 118/723 MW; 118/723 MA
[58] Field of Search ................... 118/723 MW, 118/723 MR, 723 MA; 204/192.12, 192.32, 298.16, 298.38, 298.07, 298.09, 298.15; 156/345, 643, 646; 427/553, 595

[56] References Cited

U.S. PATENT DOCUMENTS

| | | | |
|---|---|---|---|
| 4,384,918 | 5/1983 | Abe | 204/298.15 X |
| 4,399,016 | 8/1983 | Tsukada et al. | 204/298.15 X |
| 4,559,100 | 12/1985 | Ninomiya et al. | 204/298.38 X |
| 4,738,748 | 4/1988 | Kisa | 204/298.33 X |
| 4,810,342 | 3/1989 | Inoue | 204/298.08 X |
| 4,876,983 | 10/1989 | Fukuda et al. | 118/723 MR X |
| 5,015,494 | 5/1991 | Yamazaki | 118/723 MA X |
| 5,133,825 | 7/1992 | Hakamata et al. | 118/723 MR X |
| 5,181,986 | 1/1993 | Ohiwa | 118/723 MR X |
| 5,254,171 | 10/1993 | Hayakawa et al. | 118/723 MR |
| 5,292,395 | 3/1994 | Fujiwara | 118/723 MA |

OTHER PUBLICATIONS

Sugano et al., "Applications . . . VLSI Technology", 1985 pp. 142–146.

*Primary Examiner*—Nam Nguyen
*Attorney, Agent, or Firm*—Antonelli, Terry, Stout & Kraus

[57] ABSTRACT

A plasma processing method for processing a thin film formed on a substrate or forming a thin film on a substrate within a vacuum vessel provides for supplying a gas into the vacuum vessel, producing a plasma in the vacuum vessel by applying a microwave to the gas, and creating a static magnetic field represented by magnetic lines of force parallel to the direction of propagation of the microwave in the vacuum vessel by a magnetic circuit. The field intensity of the static magnetic field is determined taking into consideration the frequency of the microwave so that the same is lower than the field intensity at which electron cyclotron resonance occurs. The magnetic flux density of the static magnetic field is determined, taking into consideration the frequency of the high-frequency wave or the microwave, so that the same is not lower than the magnetic flux density at which electron cyclotron resonance occurs, and the density of the plasma is determined so that the left-hand circularly polarized wave is cut off.

26 Claims, 12 Drawing Sheets

PLASMA PROCESSING METHOD AND AN APPARATUS FOR CARRYING OUT THE SAME

BACKGROUND OF THE INVENTION

The present invention relates to an apparatus for forming thin films on substrates, processing thin films formed on substrates and removing contaminants and oxidized films from processed substrates in fabricating electronic, including semiconductor integrated circuits, liquid crystal displays and printed wiring boards, and, more particularly, to a plasma processing method and a plasma processing apparatus capable of producing a high-density plasma in a low-pressure region, of controlling the amount and energy of ions incident on a processed substrate and of forming a uniform plasma in a wide area to process a substrate having a large area uniformly and quickly without damaging the substrate by the plasma.

Plasma processing apparatuses and plasma processing methods employing microwaves are disclosed in Japanese Patent Application Laid-open (Kokai) Nos. 51-71593, 52-126175, 53-96938 and 56-155535.

These prior art plasma processing methods produce a high-density plasma by causing electron cyclotron resonance by the combination of a microwave and a static magnetic field. Generally, these methods use a microwave having a wavelength of 2.45 GHz and a static magnetic field having a field intensity of 875 Gs. Accordingly, when the density of a plasma produced by the application of microwave power reaches $7.4 \times 10^{10}/cm^3$, the left-hand circularly polarized wave (L-wave) of the microwave is cut off; and, when the microwave power is further increased, the right-hand circularly polarized wave (R-wave) increases the density of the plasma to $10^{11}/cm^3$ or above. When the density of the plasma is increased by increasing the microwave power, the density of the plasma increases stepwise, instead of increasing continuously (J. Vac. Sci. Technol. B, Vol. 9, No. 2, Mar/Apr, pp. 339-347 (1991)).

According to the above mentioned literature, the mode of the plasma jumps from a low mode, in which the density is $5 \times 10^{10}/cm^3$ to a high mode, in which the density is $5 \times 10^{11}/cm^3$, when the plasma is produced by using a microwave of 2.45 GHz.

SUMMARY OF THE INVENTION

It is an object of the present invention to provide a plasma processing method which is capable of producing a high-density plasma having an optimum density in a low-pressure region by continuously varying the density of the plasma through an optimum combination of the frequency of a microwave and the field intensity of a static magnetic field in a plasma processing apparatus employing a microwave, of controlling the amount and energy of ions incident on a substrate and of forming a uniform plasma over a wide area to process the substrate having a large area quickly and uniformly without damaging the substrate by the plasma, and to provide a plasma processing apparatus for carrying out the plasma processing method.

The present invention provides a plasma processing method for use in a plasma process in which a gas is supplied into a vacuum vessel, a plasma is produced within the vacuum vessel to process a thin film formed on a substrate or to form a thin film on a substrate, comprising producing a plasma by a microwave, and creating a static magnetic field using a magnetic circuit provided in a plasma producing unit so that the magnetic lines of force of the static magnetic field are parallel to the direction of propagation of the microwave and so that the field intensity of the static magnetic field is lower than a field intensity at which electron cyclotron resonance occurs.

The present invention provides also a plasma processing apparatus comprising a vacuum vessel, an evacuating means for evacuating the vacuum vessel, a gas supply means for supplying a gas necessary for plasma processing into the vacuum vessel, a substrate electrode for supporting a substrate, and a plasma producing means disposed opposite to the substrate electrode; the improvement comprising a plasma producing unit which uses a microwave for producing a plasma, and a magnetic circuit provided in the plasma producing unit to create a static magnetic field so that the magnetic lines of force of the static magnetic field are parallel to the direction of propagation of the microwave and so that the field intensity of the magnetic field is lower than a field intensity at which electron cyclotron resonance occurs.

An appropriate combination of the frequency of the microwave used by the plasma processing apparatus and the field intensity of the static magnetic field is determined selectively. The energy of an electromagnetic wave is absorbed efficiently by a the plasma when the direction of propagation of the electromagnetic wave is parallel to the magnetic lines of force of the static magnetic field. There are two modes of combination. The electromagnetic wave is the left-hand circularly polarized wave (L-wave) in one of the two modes and the right-hand circularly polarized wave (R-wave) in another mode. The dispersion relation for the left-hand circularly polarized wave (L-wave) is:

$$c^2 k^2/\omega^2 = 1 - (\omega_p^2/\omega_c^2)/\{1+(\omega_c/\omega)\} \qquad (1)$$

The dispersion relation for the right-hand circularly polarized wave (R-wave) is:

$$c^2 k^2/\omega^2 = 1 - (\omega_p^2/\omega_c^2)/\{1-(\omega_c/\omega)\} \qquad (2)$$

where k is the number of waves, c is the velocity of light, $\omega$ is the frequency of the incident electromagnetic wave, $\omega_p$ is the frequency of the plasma, and $\omega_c$ is the electron cyclotron frequency. FIGS. 12(a) and 12(b) show the dispersion relations (1) and (2), respectively. In FIGS. 12(a) and 12(b), $\gamma^2 = \omega_c^2/\omega^2$ represents the relation between the electron cyclotron frequency and the frequency of the incident electromagnetic wave. When the electron cyclotron frequency is equal to the frequency of the incident electromagnetic wave, $\gamma=1$, and the field intensity of the static magnetic field is 875 Gs when the frequency of the microwave is 2.45 GHz. In FIGS. 12(a) and 12(b), $\eta = \omega_p^2/\omega^2$ represents the relation between plasma frequency and the frequency of the incident electromagnetic wave. When the frequency of the incident electromagnetic wave is equal to the plasma frequency, $\eta=1$, and the plasma density is $7.4 \times 10^{10}/cm^3$ when the frequency of the microwave is 2.45 GHz. From the foregoing, with the R-wave, k is infinity and electron cyclotron resonance occurs when $\omega=\omega_c$ ($\gamma^2=1$; that is, the frequency of the microwave is 2.45 GHz and the field intensity of the static magnetic field is 875 Gs). Consequently, $\omega_p > \omega$ and the plasma density is $7.4 \times 10^{10}/cm^3$ or above (a plasma density meeting $\omega_p = \omega$, i.e., $\eta=1$) when the frequency of the microwave is 2.45 GHz; and, therefore, plasma density of $10^{11}/cm^3$ or above is possible. However, the plasma cannot be stabilized unless the plasma density is $5 \times 10^{11}/cm^3$ or above. On the contrary, with the L-wave, $\omega_p^2 = \omega^2 + \omega \cdot \omega_c$, L-wave cutoff occurs at a plasma density of about $7.4 \times 10^{10}/cm^3$ ($\eta=1$) when the frequency of the microwave is 2.45 GHz and the plasma density cannot be increased beyond $7.4\times10^{10}/cm^3$.

Since a microwave having a frequency of 2.45 GHz has a short wavelength of about 120 mm and the diameter of the processing chamber is 300 mm or above to process a large substrate, such as a semiconductor wafer of 200 mm in diameter, the electromagnetic wave in the plasma has a component perpendicular to the static magnetic field even if the direction of propagation of the microwave is parallel to the static magnetic field, which makes the plasma further unstable.

Thus, when producing a plasma by a combination of a static magnetic field and a microwave, an L-wave and an R-wave appear when the microwave is propagated in parallel to the static magnetic field, and the plasma is unstable in the plasma density range of $5\times10^{10}/cm^3$ to $5\times10^{11}/cm^3$ when the frequency of the microwave is 2.45 GHz. Since the diameter of the processing chamber is greater than the wavelength of the microwave, an electromagnetic component perpendicular to the static magnetic field is produced to affect the stability of the plasma adversely.

From the foregoing, in a plasma processing method employing a microwave of 2.45 GHz, an L-wave and an R-wave appear, and a plasma having a density in the range of $5\times10^{10}/cm^3$ to $5\times10^{11}/cm^3$ is unstable and cannot be used. When the R-wave is used as the main wave for producing a plasma and a plasma having a density of $5\times10^{11}/cm^3$ or above is used, a component perpendicular to the static magnetic field appears in the electromagnetic wave in the plasma and an electric field having a high field intensity created by the peak of the wave makes the plasma irregular and unstable because the wavelength is about twice the diameter of the diameter of the substrate. When the L-wave is used as the main wave for producing a plasma, the maximum density of the plasma is about $7.4\times10^{10}/cm^3$; and, since the density of the effective portion of the plasma is $5\times10^{10}/cm^3$ or below in view of the stability of the plasma, this plasma cannot be used for plasma processing, because the density is insufficient.

Accordingly, the present invention produces a high-density plasma by using either a method employing a microwave having a frequency higher than 2.45 GHz and a static magnetic field having a field intensity lower than that at which electron cyclotron resonance occurs to use the left-hand circularly polarized wave (L-wave) as the main wave main or a method employing a microwave having a low frequency and a static magnetic field having a field intensity not lower than that at which electron cyclotron resonance occurs to use the right-hand circularly polarized wave (R-wave) as the main wave.

The action of the microwave in a magnetic field when producing a plasma by the foregoing means will be described.

When the left-hand circularly polarized wave (L-wave) is used as the main wave to produce a plasma by a plasma processing apparatus, the right-hand circularly polarized wave (R-wave) is cut off and an electromagnetic wave is unable to propagate through the plasma; and so only the left-hand circularly polarized wave (L-wave) is able to propagate when the field intensity of the static magnetic field created in a plasma producing unit is lower than that at which electron cyclotron resonance occurs. The density of the plasma can be increased even before the left-hand circularly polarized wave (L-wave) is cut off by increasing the frequency of the microwave in this state. For example, when the frequency of the microwave is 10 GHz, a stable high-density plasma having a density in the range of about $1.24\times10^{12}/cm^3$ to about $2\times10^{12}/cm^3$, which depends on the field intensity of the static magnetic field, can be continuously produced. When the field intensity of the static magnetic field is reduced, the electron confining effect of the static magnetic field is reduced to facilitate the diffusion of electrons; and, consequently, a uniform plasma can be easily produced over a large area. Since the left-hand circularly polarized wave (L-wave) is used as the main wave to produce a plasma, the jump of the plasma from the low-density mode to the high-density mode or the transition of the same between the low-density mode and the high-density mode does not occur, and a stable high-density plasma can be produced, which enables quick plasma processing without damaging the substrate.

As mentioned above, a plasma having a density of about $3\times10^{11}/cm^3$, which is sufficiently large, can be produced by a microwave having a frequency of 4.9 GHz, which is twice the frequency of the microwave used by the conventional plasma processing apparatus, when the left-hand circularly polarized wave (L-wave) is used as the main wave. It is desirable to use a microwave having a frequency of 4.9 GHz or higher.

When the plasma processing apparatus uses the right-hand circularly polarized wave (R-wave) as the main wave to produce a plasma, the right-hand circularly polarized wave is able to propagate through a high-density plasma regardless of the density of the plasma when the field intensity of the static magnetic field created in the plasma producing unit is not lower than a density at which electron cyclotron resonance occurs. In this state ($\omega_p>\omega$), the left-hand circularly polarized wave (L-wave) is cut off, an electromagnetic wave is unable to propagate through the plasma and only the right-hand circularly polarized wave (R-wave) is able to propagate. The density of the plasma at which the left-hand circularly polarized wave (L-wave) is cut off can be lowered by lowering the frequency of the microwave; and, thereby, a zone in which the jump of plasma producing mode from the L-wave mode to the R-wave mode occurs can be set in a low plasma density zone which is not used for plasma processing. For example, when the frequency of the microwave is 500 MHz, the left-hand circularly polarized wave (L-wave) is cut off at a plasma density of $3\times10^9/cm^3$ in a low plasma density zone, and the right-hand circularly polarized wave (R-wave) is the main wave for producing a plasma in the plasma density zone for processing. When the frequency of the microwave is 500 MHz, the field intensity of the static magnetic field is 179 Gs or above, which is far lower than 875 Gs when the frequency is 2.45 GHz, the wavelength of the microwave is about 600 mm, the diameter d of the circular waveguide for cutting off the wave of the mode of the lowest order ($TE_{11}$-wave) is $\lambda/1.706$, and the wavelength of the microwave of 500 MHz is 350 mm. Accordingly, no electromagnetic field perpendicular to the static magnetic field will be created when the diameter of the processing chamber is greater than 350 mm and nearly equal to the wavelength. When the field intensity of the static magnetic field is reduced, the electron confining effect of the static magnetic field is reduced; and, consequently, electrons are able to diffuse easily, and a uniform plasma can be easily produced over a large area. Since the right-hand circularly polarized wave (R-wave) is used as the main wave to produce a plasma, the jump of the plasma from the low-density mode to the high-density mode, or the transition of the same between the low-density mode and the high-density mode occurs in a low plasma density zone which is not used for plasma processing, and no electromagnetic field perpendicular to the static magnetic field is created. Hence, a high-density plasma can be produced; and consequently, quick plasma processing can be achieved without damaging the substrate.

Recent electronic devices, such as semiconductor integrated circuits, liquid crystal displays and printed wiring boards, use a large substrate, and most semiconductor integrated circuits use wafers having a diameter of 200 mm. Therefore, processing chambers having a diameter of 300 mm or above have become used for fabricating recent electronic devices. When the right-hand circularly polarized wave (R-wave) is the main wave used to produce a plasma, it is desirable to use a microwave having a frequency not higher than 1 GHz (wavelength: 300 mm) that does not cut off the wave in the mode of the lowest order ($TE_{11}$-wave) of the waveguide.

According to the present invention, a stable high-density plasma for plasma processing, having a necessary plasma density, can be produced without producing a jump of the plasma from the low-density mode to the high-density mode and the transition of a plasma between the low-density mode and the high-density mode no, electromagnetic field perpendicular to the static magnetic field is created, and a stable plasma can be produced with an electromagnetic wave of a single mode. Consequently, quick plasma processing can be achieved without damaging the substrate. A high-density plasma can be produced in a low-pressure region by continuously varying the plasma density to an optimum plasma density to control the energy and the number of ions that fall on the substrate. Since the field intensity of the static magnetic field for producing a plasma may be about half the field intensity of the static magnetic field employed in conventional plasma processing in either a case where the ECR (electron cyclotron resonance) state is established or in a case where the ECR state is not established, the plasma is able to diffuse easily and uniformly over a large area, and high-frequency electric power can be uniformly applied to a substrate having a large area to process the large substrate quickly for plasma processing by the plasma without damaging the same with the plasma.

DESCRIPTION OF THE PREFERRED EMBODIMENTS

Figure 1:
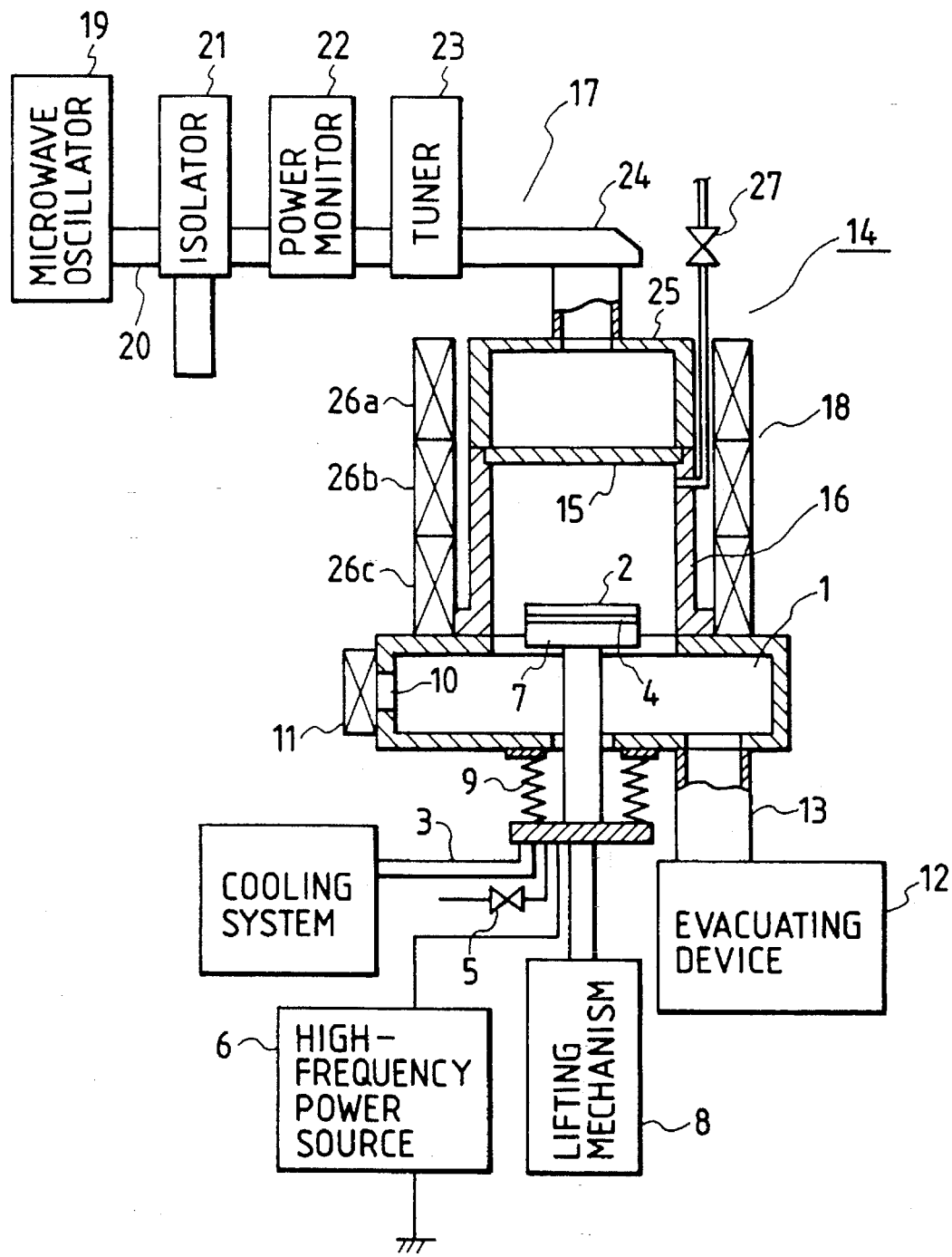
FIG. 1 is a schematic, partly sectional, view of a plasma processing apparatus in a first embodiment according to the present invention.

First Embodiment (FIG. 1)

A plasma processing apparatus forming a first embodiment according to the present invention will be described as applied to dry etching process with reference to FIG. 1. This plasma processing apparatus uses the left-hand circularly polarized wave (L-wave) of a microwave to produce a plasma. Referring to FIG. 1, a substrate 2 is mounted on an electrode stage 7 provided with an electrostatic attraction mechanism 4 and is disposed within a processing chamber 1 defined by a vacuum processing vessel. The temperature of the substrate 2 is controlled by a cooling system 3 during plasma processing. The electrode stage 7 can be moved in vertical direction by a lifting mechanism 8. A cooling gas supply unit 5, for supplying a cooling gas, such as He gas, for ensuring efficient heat transfer between the substrate 2 and the surface of the electrode stage 7, is connected to the flange of a bellows sealing the processing chamber 1. The electrode stage 7 is connected to a high-frequency power source 6 for applying a high-frequency bias to the substrate 2. The vacuum processing vessel defining the processing chamber 1 is provided with an opening 10 through which the substrate 2 is put in and taken out from the processing chamber 1, and a gate valve 11 for closing the opening 10. An evacuating device 12, for evacuating the processing chamber 1 to a vacuum state and for exhausting a processing gas, is connected to the processing chamber 1 by an exhaust pipe 13. An opening is formed in the upper wall of the vacuum processing vessel defining the processing chamber 1 and a plasma producing unit 14 is mounted on the upper wall of the vacuum processing vessel. The plasma producing unit 14 comprises, a plasma producing vessel defining a plasma producing chamber 16 provided with a microwave guide member 15 formed of a material which is not permeable to gasses but is transmissive to microwaves, such as quartz or alumina ceramic; a microwave oscillator 19; a microwave guide system 17 for guiding a microwave generated by the microwave oscillator 19 into the plasma producing chamber 16; and a magnetic circuit 18 for creating a magnetic field parallel to the direction of propagation of the microwave within the plasma producing chamber 16. The microwave is propagated through the microwave guide member 15 from the atmosphere into a vacuum by electromagnetic coupling. The microwave guide member 15 may be a rod antenna, a slot antenna, a flat antenna or a combination of these antennas. The microwave guide system 17 comprises a rectangular waveguide 20 connected to the microwave oscillator 19, an isolator 21, a power monitor 22, a tuner 23, a converting waveguide 24 and a circular waveguide 25 connected to the plasma producing vessel defining the plasma producing chamber 16, which are connected sequentially in that order. The power monitor 22 and the tuner 23 may be omitted. The magnetic circuit 18 is provided with a plurality of coils 26a, 26b and 26c to create a magnetic field of a desired profile within the plasma producing chamber 16. The magnetic circuit 18 may be provided with a single coil, two coils or four or more coils, provided that the magnetic circuit 18 is able to create a magnetic field of a desired profile. A gas supply system 27 supplies a processing gas into the plasma producing chamber 16. If need be, a plurality of gas supply systems may be connected to the plasma producing chamber 16.

The field intensity of the magnetic field created by the magnetic circuit 18 is less than a field intensity at which electron cyclotron resonance (ECR) between the microwave generated by the microwave oscillator 19 and electrons of a plasma produced in the plasma producing chamber 16 occurs, and the field intensity of the magnetic field is determined so that only-the left-hand circularly polarized wave (L-wave) propagates through the plasma producing chamber 16. The frequency of the microwave oscillator 19 is 4.9 GHz or higher, which is twice a frequency of 2.45 GHz or higher. The density of the plasma is equal to or higher than that of a plasma used in the conventional microwave plasma processing of an ECR system. The density of the plasma is $3 \times 10^{11}/cm^3$ when the frequency of the microwave oscillator 19 is 4.9 GHz, $5 \times 10^{11}/cm^3$ when 6.3 GHz, and $1.24 \times 10^{12}/cm^3$ when 10 GHz. The field intensity of the magnetic field is less than 1752GS for a frequency of 4.9 GHz of the microwave oscillator 19, less than 2252 Gs for 6.3 GHz, and less than 3575 GS for 10 GHz. The field intensity of the magnetic field need not necessarily be changed according to the frequency; that is the field intensity of the magnetic field may be 875 Gs or below for ECR when the frequency of the microwave is 2.45 GHz, which has been used in conventional plasma processing of a microwave ECR system. The higher the field intensity of the magnetic field, the greater is the density of the plasma. However, densities of $3 \times 10^{11}/cm^3$ for 4.9 GHz, $5 \times 10^{11}/cm^3$ for 6.3 GHz and $1.24 \times 10^{12}/cm^3$ for 10 GHz can be secured when the field intensity of the magnetic field is in the range of a few gausses to several tens of gausses. Therefore, the field intensity of the magnetic field need not be very high, provided that the magnetic field is able to prevent the diffusion of the plasma. An excessively high field intensity of the magnetic field is undesirable, because a magnetic field having an excessively high field intensity adversely affects the uniform application of high-frequency bias to the substrate 2. Thus, ECR need not be caused, the field intensity of the magnetic field need not be very high, the plasma is able can be made to diffuse easily and uniformly over a large area, high-frequency power can be uniformly applied to the substrate 2 even if the same is large, and the substrate 2 can be uniformly processed even if the same is large.

Thus, the plasma processing apparatus uses the left-hand circularly polarized wave (L-wave) as a main wave to produce a stable high-density plasma having a given density without entailing a jump and is capable of quick plasma-processing of the substrate 2.

Figure 2:
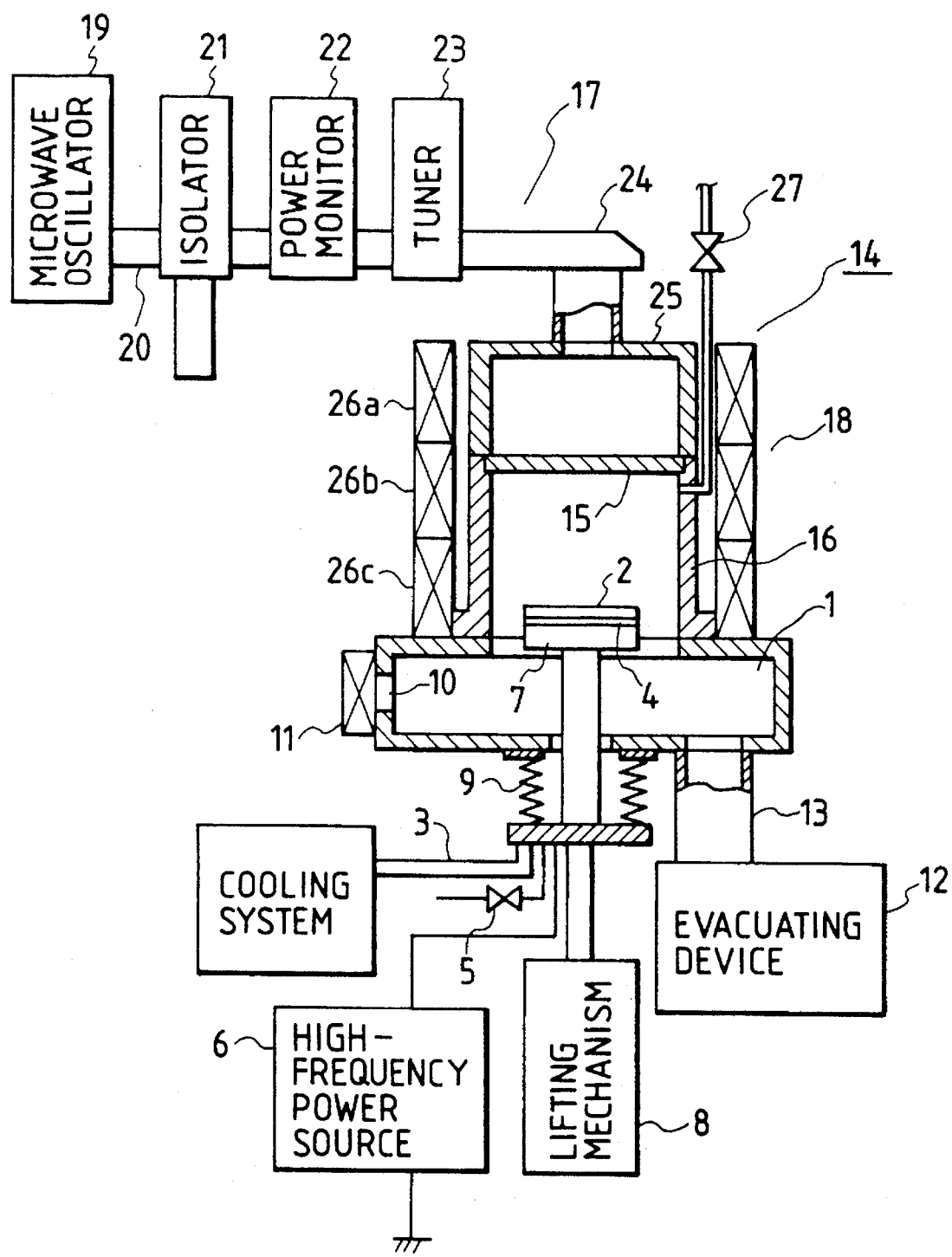
FIG. 2 is a schematic, partly sectional, view of a plasma processing apparatus in a second embodiment according to the present invention.

Second Embodiment (FIG. 2)

A plasma processing apparatus in a second embodiment according to the present invention will be described for use in a dry etching process with reference to FIG. 2. This plasma processing apparatus uses the right-hand circularly polarized wave (R-wave) of a microwave to produce a plasma. Referring to FIG. 2, a substrate 2 is mounted on a substrate stage 7 provided with an electrostatic attraction mechanism 4 and is disposed within a processing chamber 1 defined by a vacuum processing vessel. The temperature of the substrate 2 is controlled by a cooling system 3 during plasma processing. The electrode stage 7 can be moved in the vertical direction by a lifting mechanism 8. A cooling gas supply unit 5 for supplying a cooling gas, such as He gas, for ensuring efficient heat transfer between the substrate 2 and the surface of the electrode stage 7, is connected to the flange of a bellows sealing the processing chamber 1. The electrode stage 7 is connected to a high-frequency power source 6 for applying a high-frequency bias to the substrate 2. The vacuum processing vessel defining the processing chamber 1 is provided with an opening 10 through which the substrate 2 is put in and taken out from the processing chamber 1, and a gate valve 11 is provided for closing the opening 10. An evacuating device 12, for evacuating the processing chamber 1 to a vacuum state and for exhausting a processing gas, is connected to the processing chamber 1 by an exhaust pipe 13. An opening is formed in the upper wall of the vacuum processing vessel defining the processing chamber 1 and a plasma producing unit 14 is mounted on the upper wall of the vacuum processing vessel. The plasma producing unit 14 comprises: a plasma producing vessel defining a plasma producing chamber 16 provided with a microwave guide member 15 formed of a material which is not permeable to gasses but is transmissive to microwaves, such as quartz or alumina ceramic; a microwave oscillator 19; a microwave guide system 17 for guiding a microwave generated by the microwave oscillator 19 into the plasma producing chamber 16; and a magnetic circuit 18 for creating a magnetic field parallel to the direction of propagation of the microwave within the plasma producing chamber 16. The microwave is propagated through the microwave guide member 15 from the atmosphere into a vacuum by electromagnetic coupling. The microwave guide member 15 may be a rod antenna, a slot antenna, a flat antenna or a combination of these antennas. The microwave guide system 17 comprises a rectangular waveguide 20 connected to the microwave oscillator 19, an isolator 21, a power monitor 22, a tuner 23, a converting waveguide 24 and a circular waveguide 25 connected to the plasma producing vessel defining the plasma producing chamber 16, which are connected sequentially in that order. The power monitor 22 and the tuner 23 may be omitted. The magnetic circuit 18 is provided with a plurality of coils 26a, 26b and 26c to create a magnetic field of a desired profile within the plasma producing chamber 16. The magnetic circuit 18 may be provided with a single coil, two coils or four or more coils, provided that the magnetic circuit 18 is able to create a magnetic field of a desired profile. A gas supply system 27 supplies a processing gas into the plasma producing chamber 16. If need be, a plurality of gas supply systems may be connected to the plasma producing chamber 16.

The microwave oscillator 19 generates a microwave of a comparatively low frequency, and the magnetic circuit 18 creates a magnetic field having a field intensity not lower than a field intensity at which electron cyclotron resonance (ECR) between electrons of a plasma produced in the plasma producing chamber 16 and the microwave occurs. The frequency of the microwave oscillator 19 is 1.22 GHz or lower, which is not higher than half the frequency of 2.45 GHz, which has been used in the conventional plasma processing of a microwave ECR system. Consequently, the left-hand circularly polarized wave (L-wave) is cut off when the density of the plasma is $1.85 \times 10^{10}/cm^3$. When the frequency is 500 MHz, the density of the plasma is $3 \times 10^9/cm^3$ and the right-hand circularly polarized wave (R-wave) is used as the main wave for producing the plasma. The frequency of the microwave oscillator 19 is determined so that the wavelength of the microwave is as large as twice the diameter of the plasma producing chamber or below to suppress the generation of electromagnetic waves perpendicular to the magnetic field created by the magnetic circuit 18 in the plasma producing chamber. When the frequency of the microwave oscillator 19 is 1.12 GHz, the field intensity of the magnetic field is 436 Gs or higher, which is half the field intensity necessary for the conventional plasma processing. Consequently, a high-frequency bias can be applied uniformly to the substrate 2 to enable the uniform processing of a large substrate.

Figure 3:
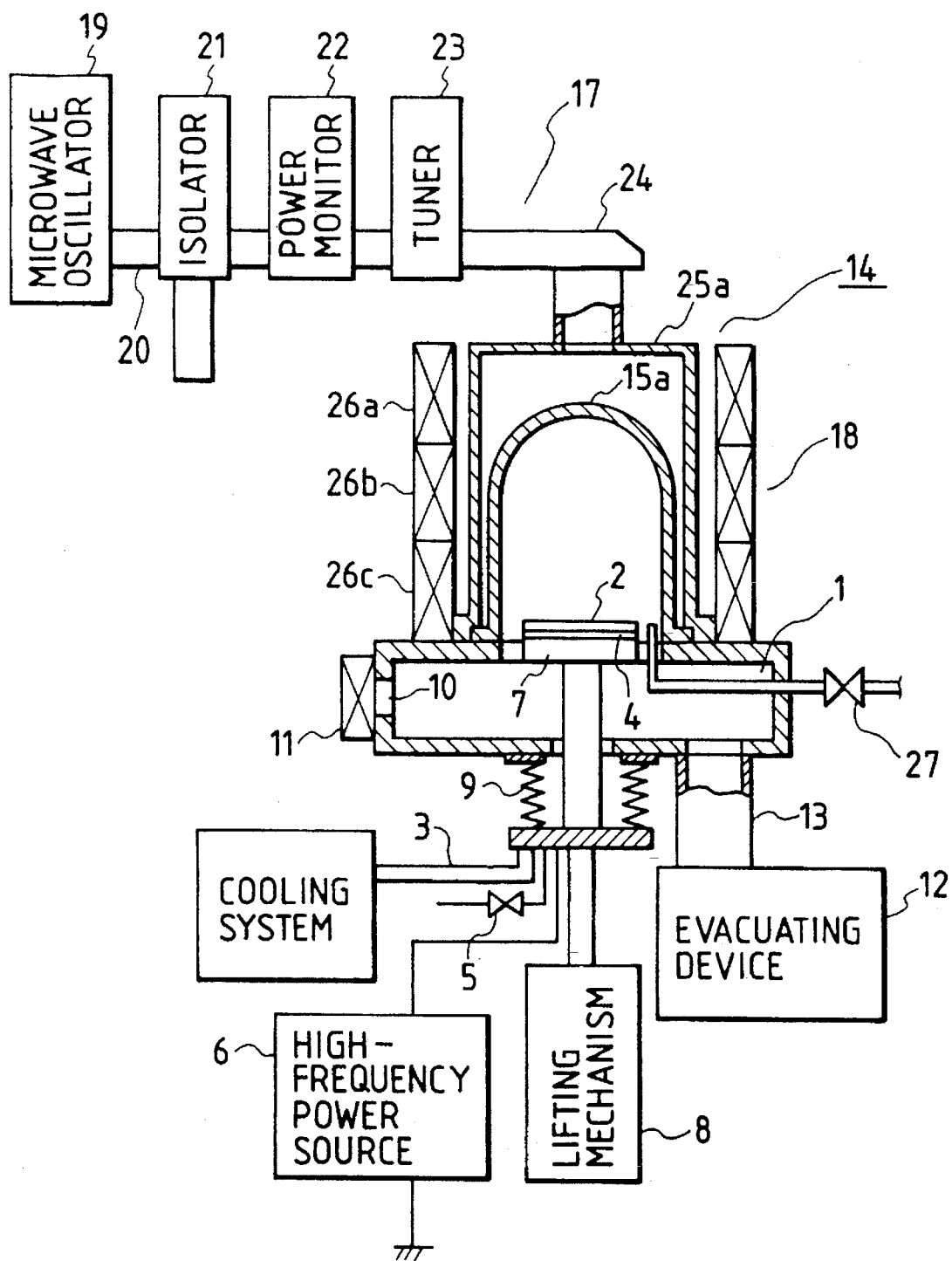
FIG. 3 is a schematic, partly sectional, view of a plasma processing apparatus in a third embodiment according to the present invention, provided with a plasma producing chamber which is a modification of a plasma producing chamber employed in the first and second embodiments.

Third Embodiment (FIG. 3)

A plasma processing apparatus in a third embodiment according to the present invention will be described for use in a to dry etching process with reference to FIG. 3. This plasma processing apparatus shown in FIG. 3 is provided with a plasma producing chamber differing from those of the plasma processing apparatuses shown in FIGS. 1 and 2. Referring to FIG. 3, a plasma producing chamber is defined by a microwave guide member 15a formed of a material which is not permeable to gases, but is transmissive to microwaves, such as quartz or alumina ceramic. A waveguide 25a is mounted on the upper wall of a processing vessel defining a processing chamber 1 so as to surround the microwave guide member 15a. Since the plasma producing chamber is surrounded by the microwave guide member 15a formed of quartz or an alumina ceramic and no metal parts are exposed to the plasma, no metals will be caused to sputter and the substrate 2 will not be contaminated by any metals. A gas supply system 27 supplies a processing gas through the processing chamber 1 into the plasma producing chamber. In this configuration, since the processing gas is supplied upward from below the substrate 2 and the processing gas is exhausted downward from above the substrate 2 by an evacuating device 12, the processing gas is liable to flow irregularly with respect to the substrate 2.

Figure 4:
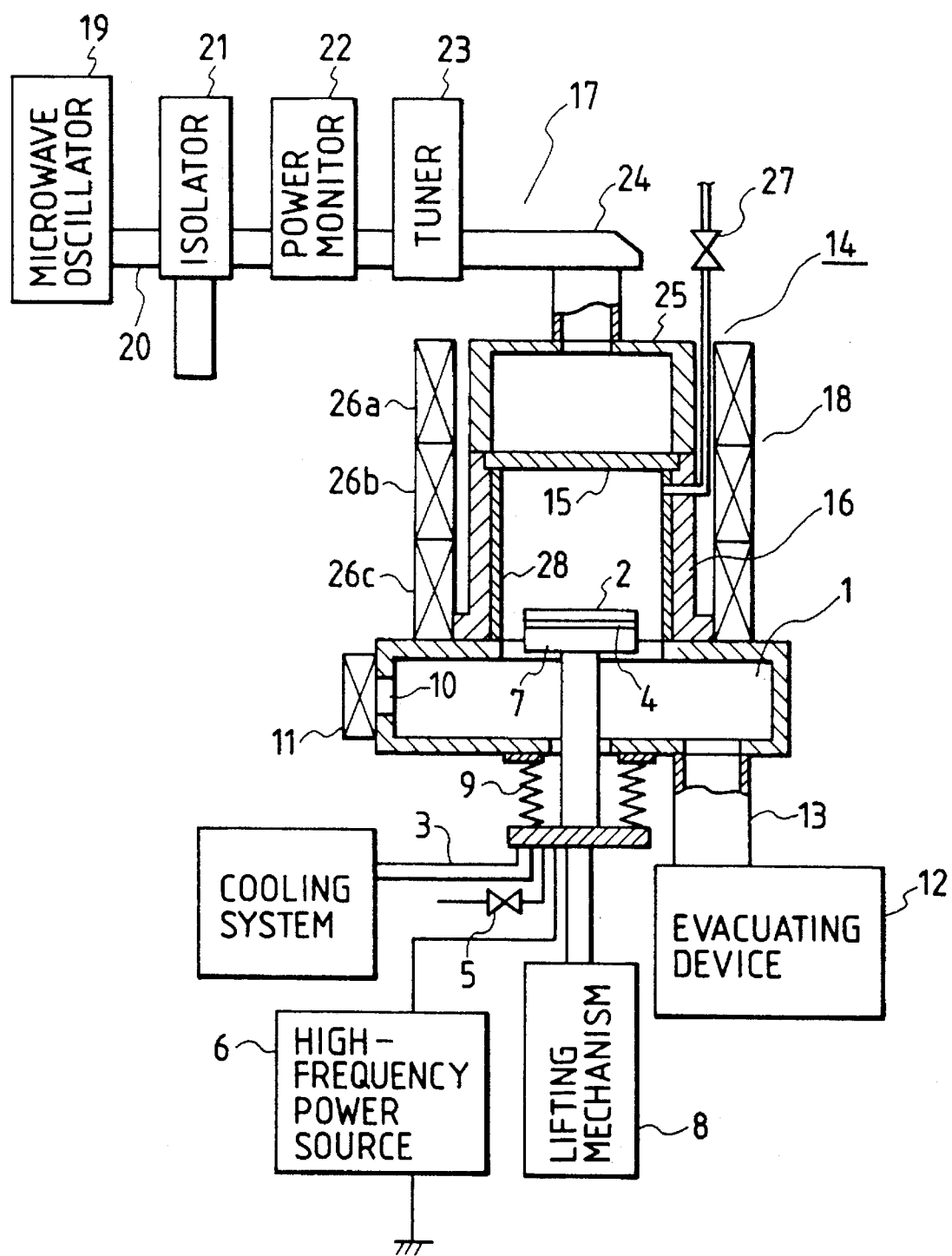
FIG. 4 is a schematic, partly sectional, view of a plasma processing apparatus in a fourth embodiment according to the present invention provided with a plasma processing chamber which is a modification of a plasma producing chamber employed in the first and second embodiments.

Fourth Embodiment (FIG. 4)

A plasma processing apparatus in a fourth embodiment according to the present invention has been designed to overcome the foregoing disadvantage of the plasma processing apparatus in the third embodiment. The plasma processing apparatus in the third embodiment is substantially the same in construction as those in the first and second embodiment, except that the plasma processing apparatus in the third embodiment is provided with a plasma producing vessel defining a plasma producing chamber 16, lined with a quartz cylinder 28 as shown in FIG. 4. Since the plasma producing vessel is lined with the quartz cylinder 28, no metals are caused to sputter from the walls of the plasma producing vessel, and so the substrate 2 will not be contaminated with metals.

Figure 5:
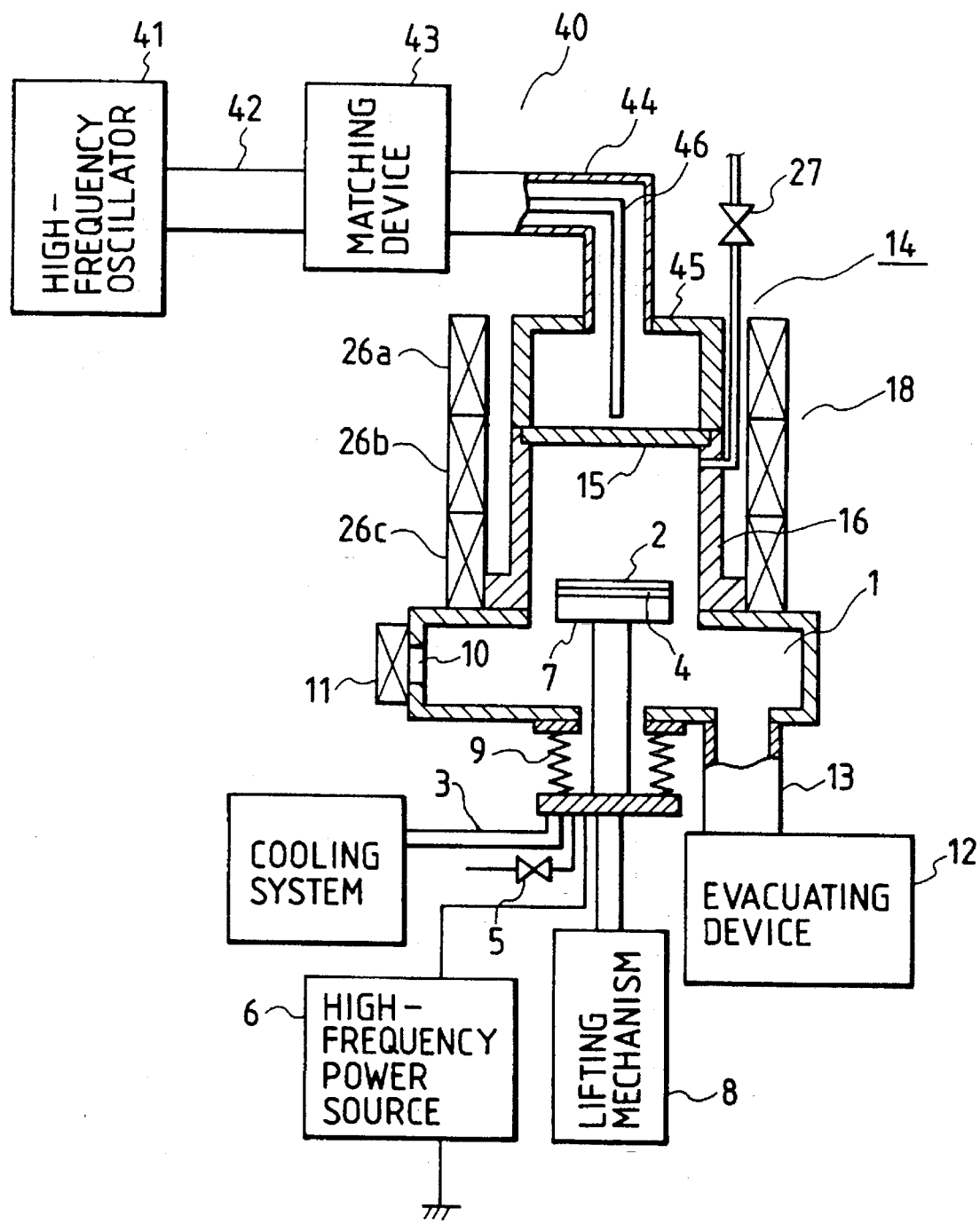
FIG. 5 is a schematic, partly sectional, view of a plasma processing apparatus in a fifth embodiment according to the present invention.

Fifth Embodiment (FIG. 5)

A plasma processing apparatus in a fifth embodiment according to the present invention will be described hereinafter with reference to FIG. 5. This plasma processing apparatus is similar to that shown in FIG. 2 in construction, except that the former is provided with a high-frequency wave guide system 40 which is different from the microwave guide system 17 of the latter. The plasma processing apparatus in the fifth embodiment is suitable for using a microwave of a frequency around 500 MHz or a high-frequency wave of several hundred megahertz. The high-frequency wave guide system 40, which may be used also for guiding a microwave, comprises a matching device 43 connected to a high-frequency oscillator 41 by a high-frequency wave transmission device 42, a coaxial waveguide 44 connected to the matching device 43, and a waveguide 45 connected to the coaxial waveguide 44. A portion of predetermined length of the central conductor 46 of the coaxial waveguide 44 may be extended into the waveguide 45 for satisfactory matching with the load, i.e., a plasma. The diameter of the coaxial waveguide 44 is on the order of 100 mm. If a rectangular wave guide is employed instead of the coaxial waveguide 44 for guiding a high-frequency wave of a frequency on the order of 100 MHz, the width of the rectangular wave guide must be in the range of 300 mm to 400 mm, which is far greater than the diameter of the coaxial waveguide 44. When the frequency of the high-frequency oscillator 41 is 500 MHz, the cut-off diameter of a plasma producing chamber 16 is 352 mm, and a single microwave mode can be established when the diameter of a plasma producing chamber is on the order of 360 mm. Thus, no electromagnetic field perpendicular to the static magnetic field is created and a stable plasma can be produced with an electromagnetic wave of a single mode. Since the electron confining effect of the static magnetic field can be reduced by reducing the field intensity of the static magnetic field, electrons are able to diffuse easily to form a plasma uniformly over a wide area. Since the right-hand circularly polarized wave (R-wave) is used as a main wave for producing the plasma, the jump and transition of the density of the plasma occur in a low-density zone which is not used for plasma processing and no electromagnetic field perpendicular to the static magnetic field is created. Accordingly, a stable, high-density plasma can be produced and the substrate can be quickly plasma-processed without being damaged by the plasma.

Figure 6:
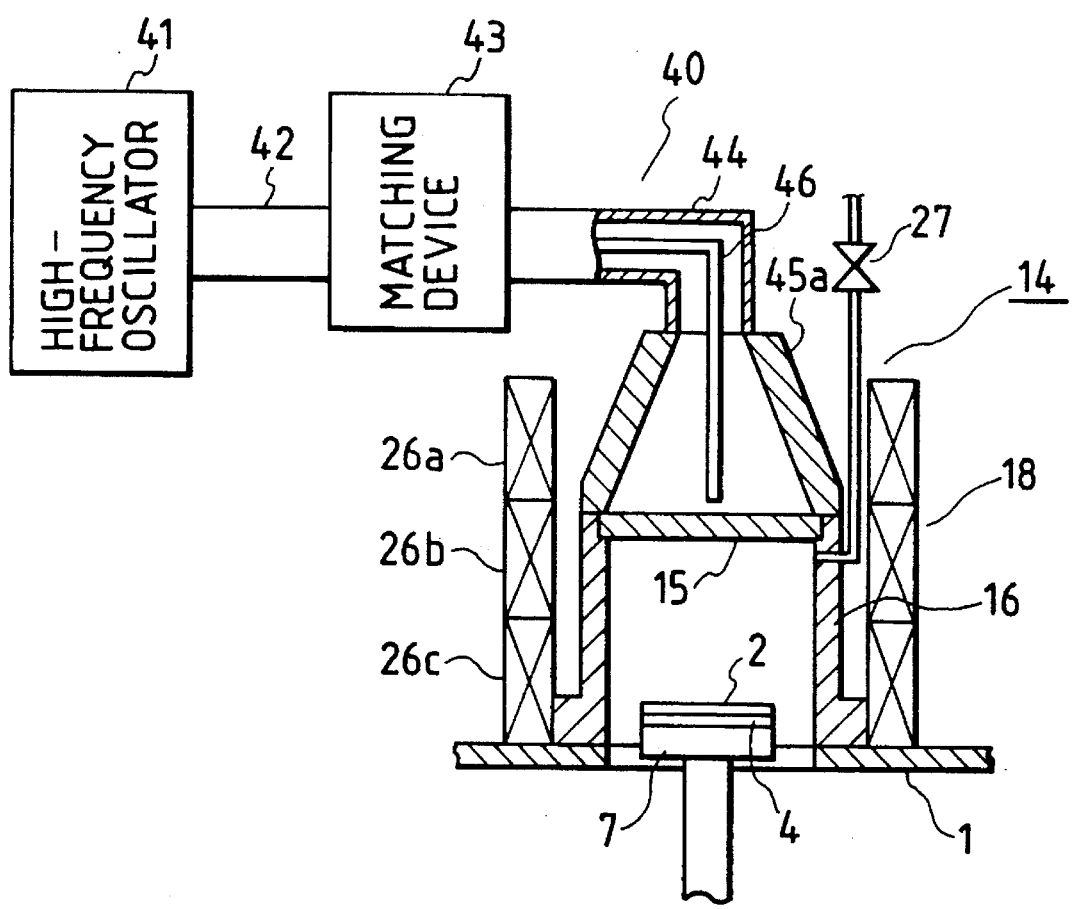
FIG. 6 is a schematic, partly sectional, view of a plasma processing apparatus in a sixth embodiment according to the present invention provided with a waveguide which is a modification of a waveguide employed in the fifth embodiment.

Sixth Embodiment (FIG. 6)

A plasma processing apparatus in a sixth embodiment according to the present invention shown in FIG. 6 is a modification of the plasma processing apparatus shown in FIG. 5. In the plasma processing apparatus shown in FIG. 5, the joint efficiency of the high-frequency wave guide system 40 is reduced because the coaxial waveguide 44 and the waveguide 45, which differ in diameter from each other, are connected stepwise. The plasma processing apparatus shown in FIG. 6 is provided with a coaxial waveguide 44 and a tapered waveguide 45a having an upper end joined to the coaxial waveguide 44 and having an inside diameter equal to that of the coaxial waveguide 44. Reflection at the junction of the coaxial waveguide 44 and the waveguide 45a is reduced to enhance the joint efficiency.

Figure 7:
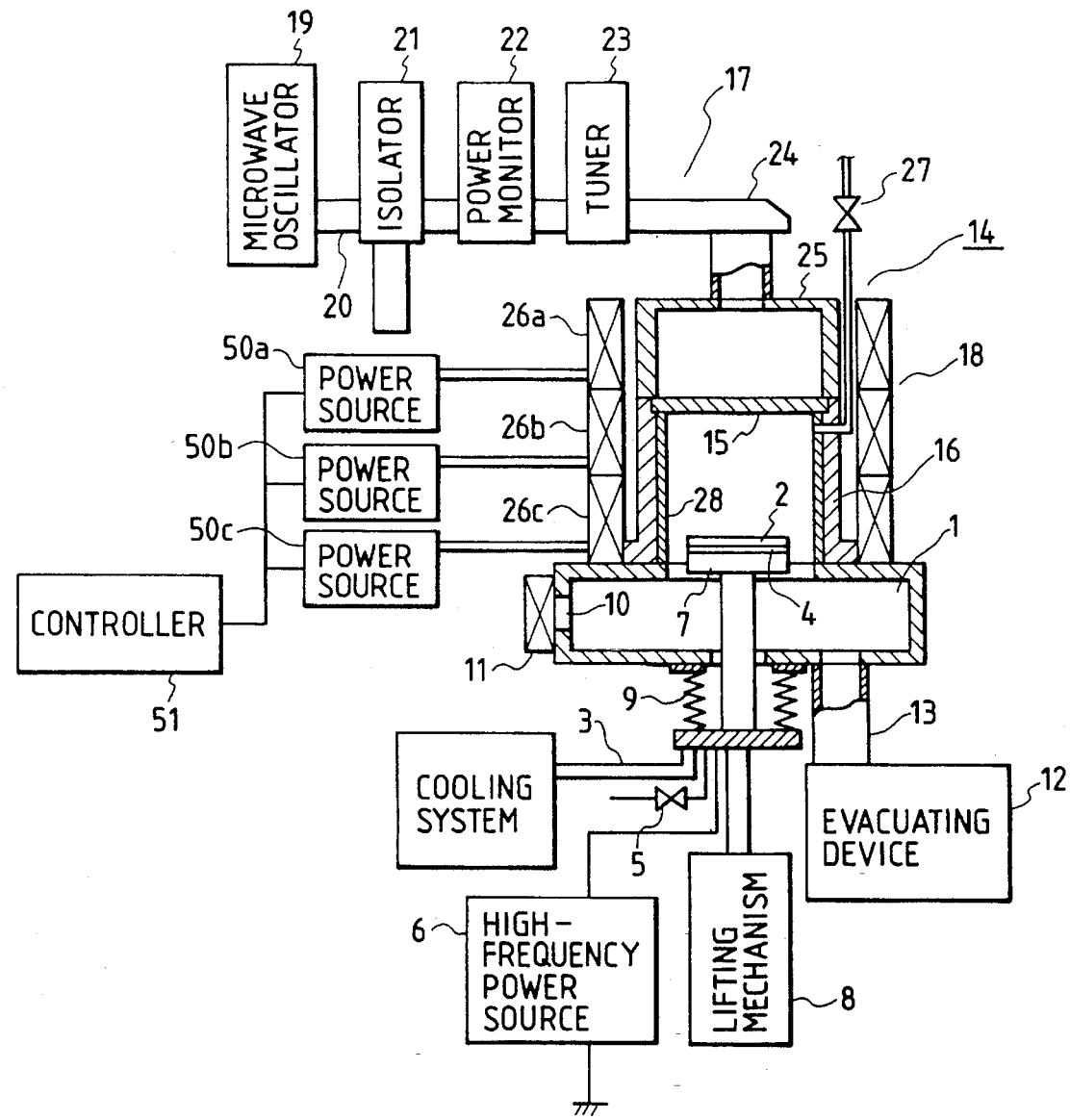
FIG. 7 is a schematic, partly sectional, view of a plasma processing apparatus in a seventh embodiment according to the present invention provided with a solenoid similar to that employed in the fourth embodiment.

Seventh Embodiment (FIG. 7)

A plasma processing apparatus in a seventh embodiment according to the present invention shown in FIG. 7 is substantially the same in construction as the plasma processing apparatus shown in FIG. 4. As shown in FIG. 7, this plasma processing apparatus is provided with a magnetic circuit 18 comprising coils 26a, 26b and 26c connected respectively to individual power sources 50a, 50b and 50c. The respective outputs of the power sources 50a, 50b and 50c are controlled by a controller 51 to control the electromagnetic wave absorption rate of the plasma and the density of the plasma on the surface of the substrate by properly varying the profile and field intensity of a static magnetic field created in a plasma producing chamber 16.

Figure 8:
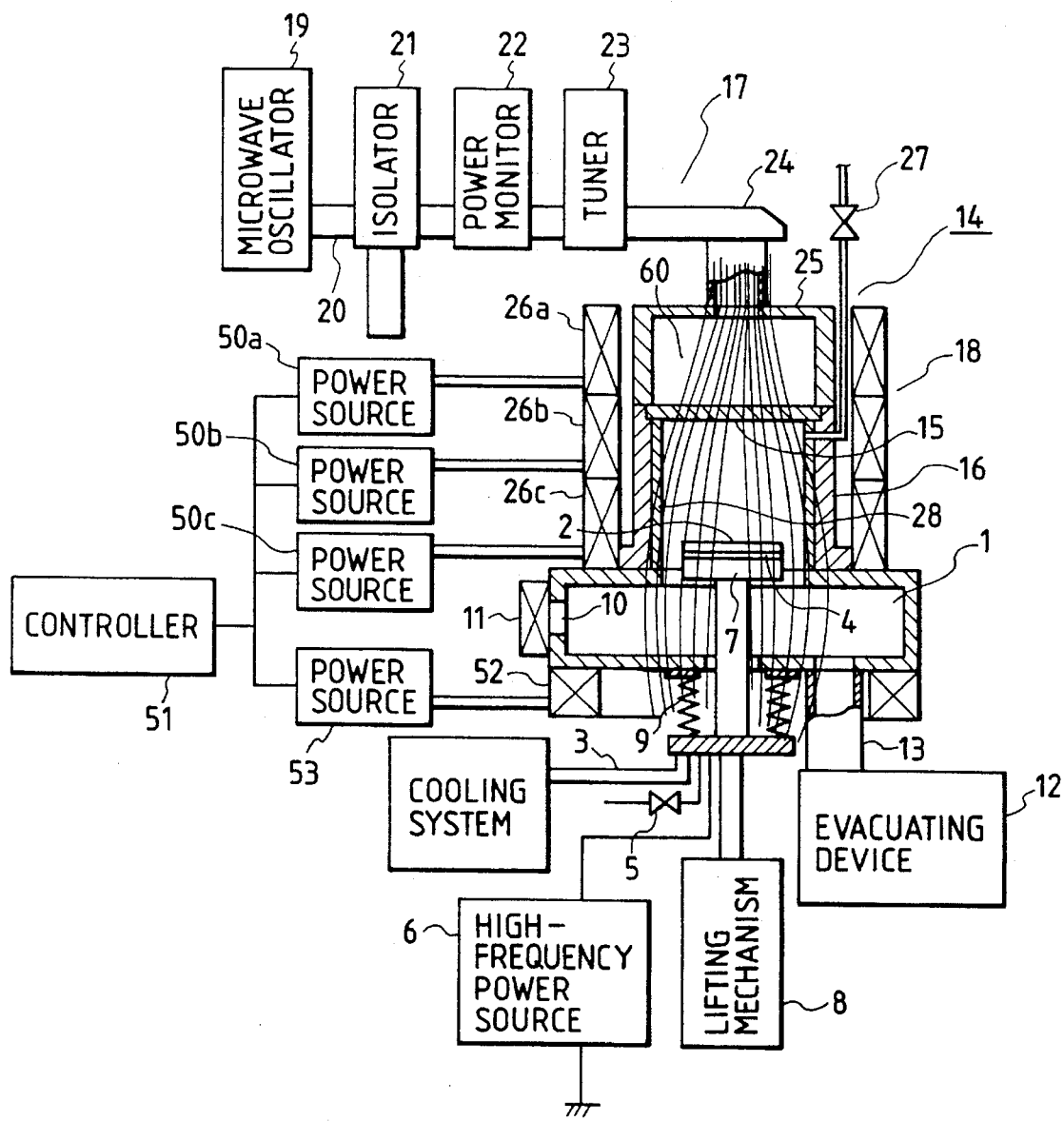
FIG. 8 is a schematic, partly sectional, view of a plasma processing apparatus in an eighth embodiment according to the present invention provided with a solenoid on the lower surface of a processing chamber in addition to the components of the seventh embodiment to create a mirror magnetic field.

Eighth Embodiment (FIG. 8)

A plasma processing apparatus in an eighth embodiment according to the present invention shown in FIG. 8 is a modification of the plasma processing apparatus shown in FIG. 7. As shown in FIG. 8, a coil 51 is disposed under the bottom wall of a processing vessel defining a processing chamber 1 and is connected to a power source 53 controlled by a controller 51. Coils 26a, 26b and 26c for creating a static magnetic field in a plasma producing chamber 16 are connected respectively to power sources 50a, 50b and 50c controlled by the controller 51. Currents are supplied from the power sources 50a, 50b, 50c and 53, respectively, to the coils 26a, 26b, 26c and 52 so that the coils 26a, 26b, 26c and 52 are energized in the same polarity to create a mirror magnetic field. Thus, the electron confining effect of the static magnetic field is enhanced, and a high-density plasma can be produced.

Figure 9:
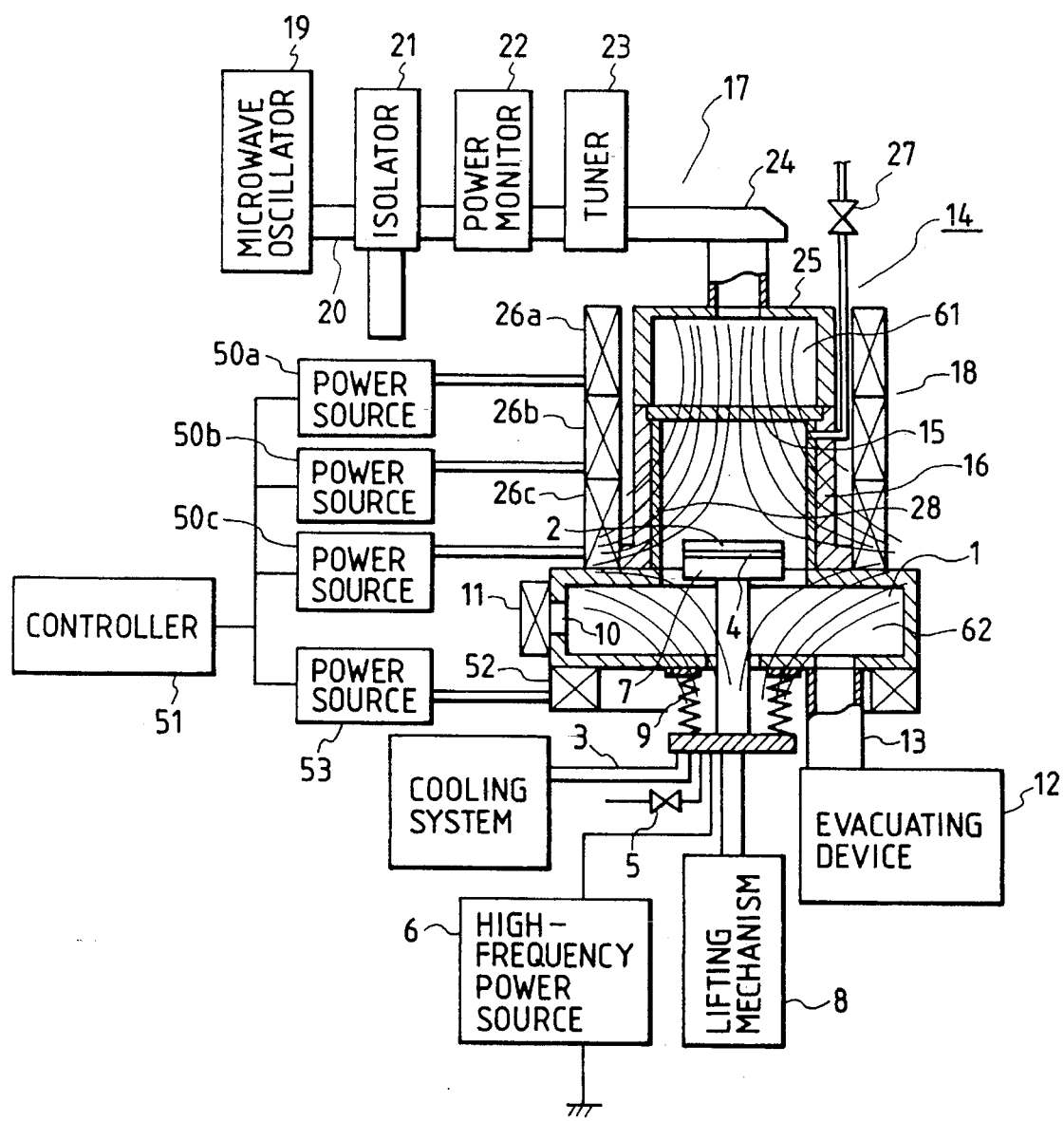
FIG. 9 is a schematic, partly sectional, view of a plasma processing apparatus in a ninth embodiment according to the present invention provided with a solenoid on the lower surface of a processing chamber in addition to the components of the seventh embodiment to create a cusped magnetic field.

Ninth Embodiment (FIG. 9)

A plasma processing apparatus in a ninth embodiment according to the present invention shown in FIG. 9 is a futher modification of the plasma processing apparatus shown in FIG. 7. As shown in FIG. 9, a coil 52 is disposed under the bottom wall of a processing vessel defining a processing chamber 1 and is connected to a power source 53 controlled by a controller 51. Coils 26a, 26b and 26c for creating a static magnetic field in a plasma producing chamber 16 are connected respectively to power sources 50a, 50b and 50c controlled by the controller 51. The controller 51 controls the power sources 50a, 50b, 50c and 53 so that the polarity of a magnetic field created by the coil 52 is opposite that of magnetic fields created by the coils 50a, 50b and 50c to create a cusped magnetic field. The cusped magnetic field confines electrons effectively in a plasma to produce a high-density plasma. Since the field intensity of the cusped magnetic field on the substrate is comparatively small, electrons are able to diffuse easily over the surface of the substrate to improve the uniformity of the plasma over the surface of the substrate.

Figure 10:
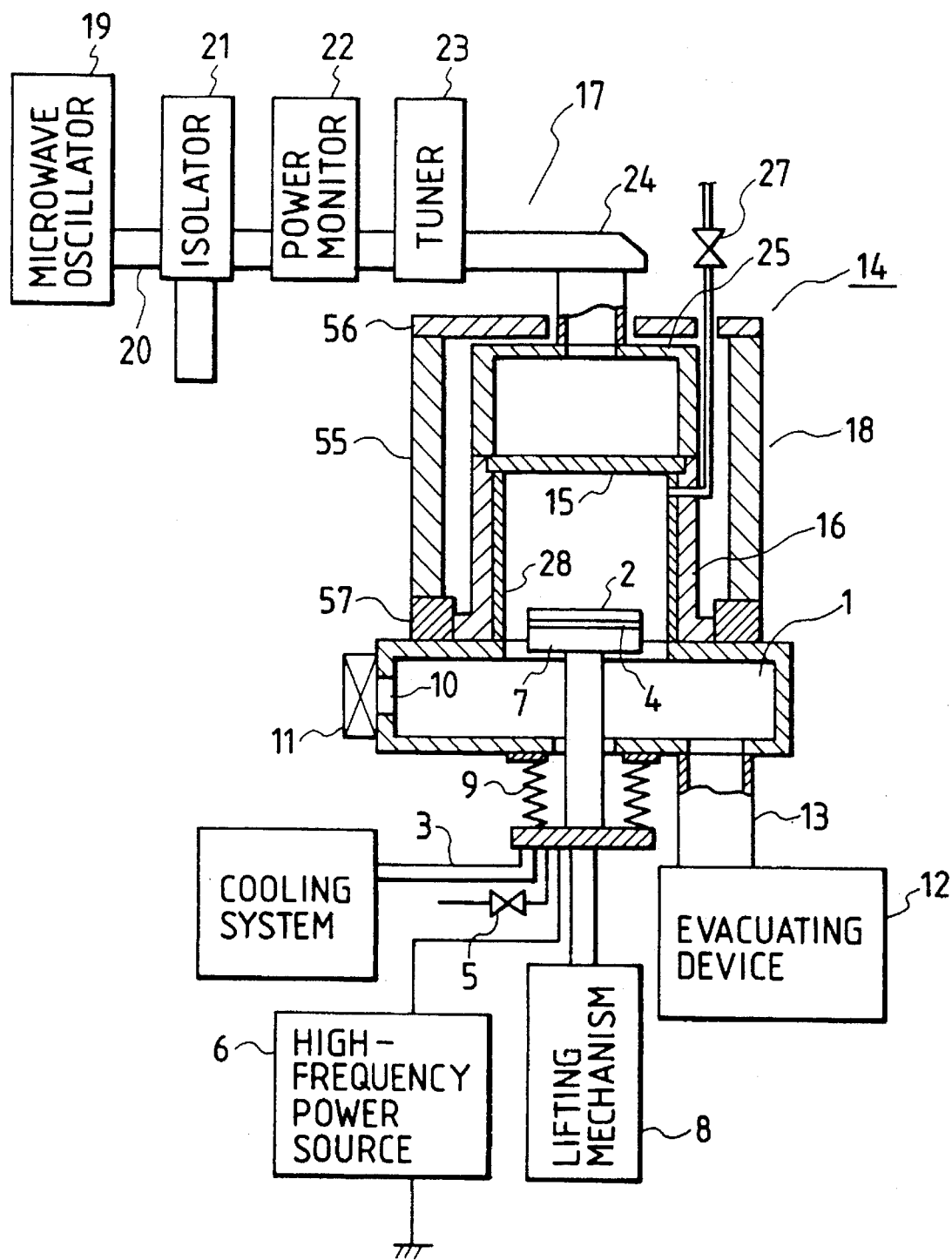
FIG. 10 is a schematic, partly sectional, view of a plasma processing apparatus in a tenth embodiment according to the present invention provided with a permanent magnet and a yoke instead of a solenoid employed in the fourth embodiment.

Tenth Embodiment (FIG. 10)

A plasma processing apparatus in a tenth embodiment according to the present invention as shown in FIG. 10 is a modification of the plasma processing apparatus shown in FIG. 4. As shown in FIG. 10, the plasma processing apparatus is provided with a permanent magnet 55 and a lower yoke 57 instead of the coils 26a, 26b and 26c of the magnetic circuit 18 of the plasma processing apparatus shown in FIG. 4. The use of the permanent magnet 11 and the lower yoke 57 in combination enables the omission of the power source, and hence the plasma processing apparatus shown in FIG. 10 can be manufactured at a comparatively low cost.

Figure 11:
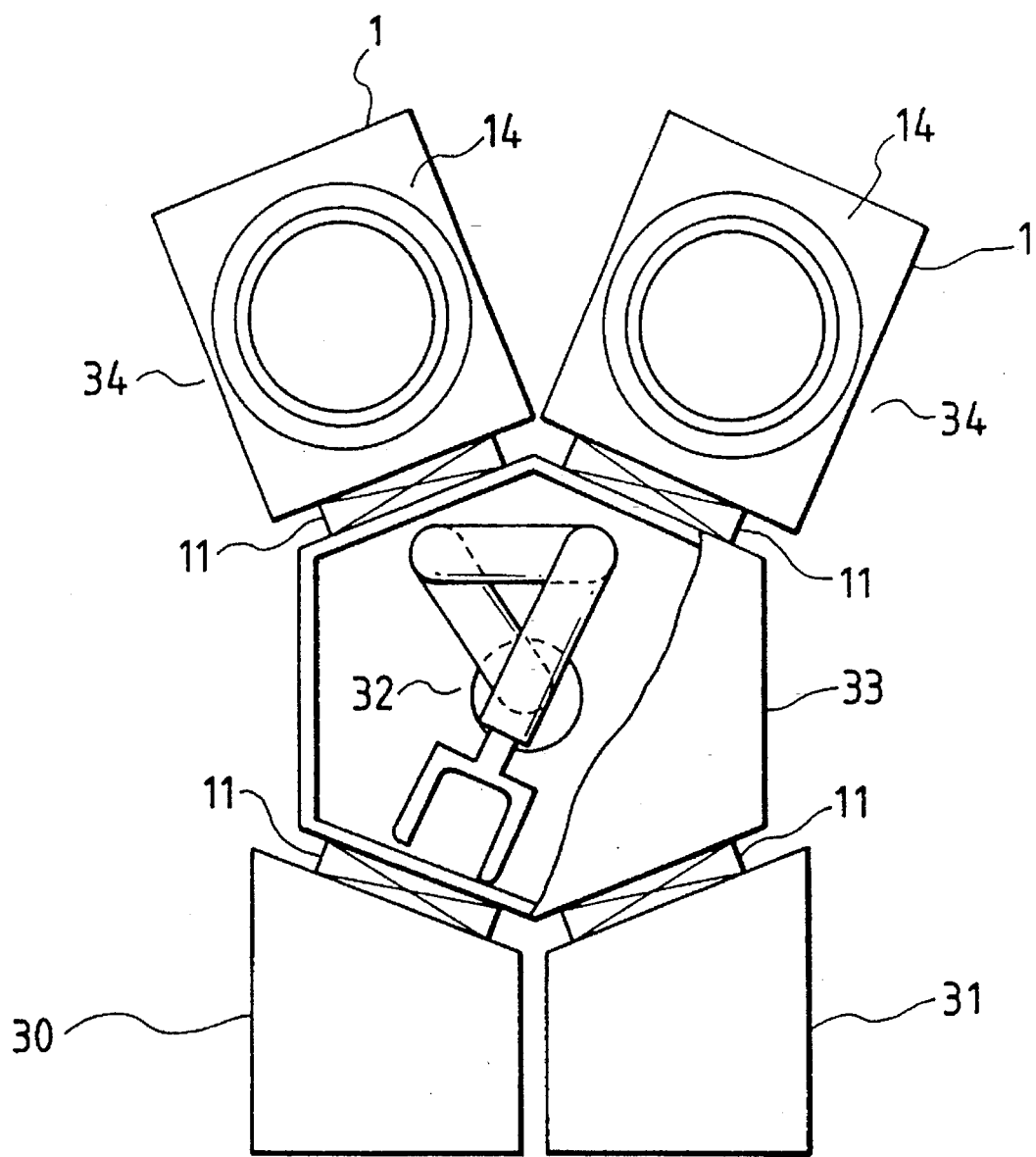
FIG. 11 is a schematic plan view of an automatic substrate processing apparatus incorporating plasma processing apparatuses in accordance with the present invention.
Figure 12B:
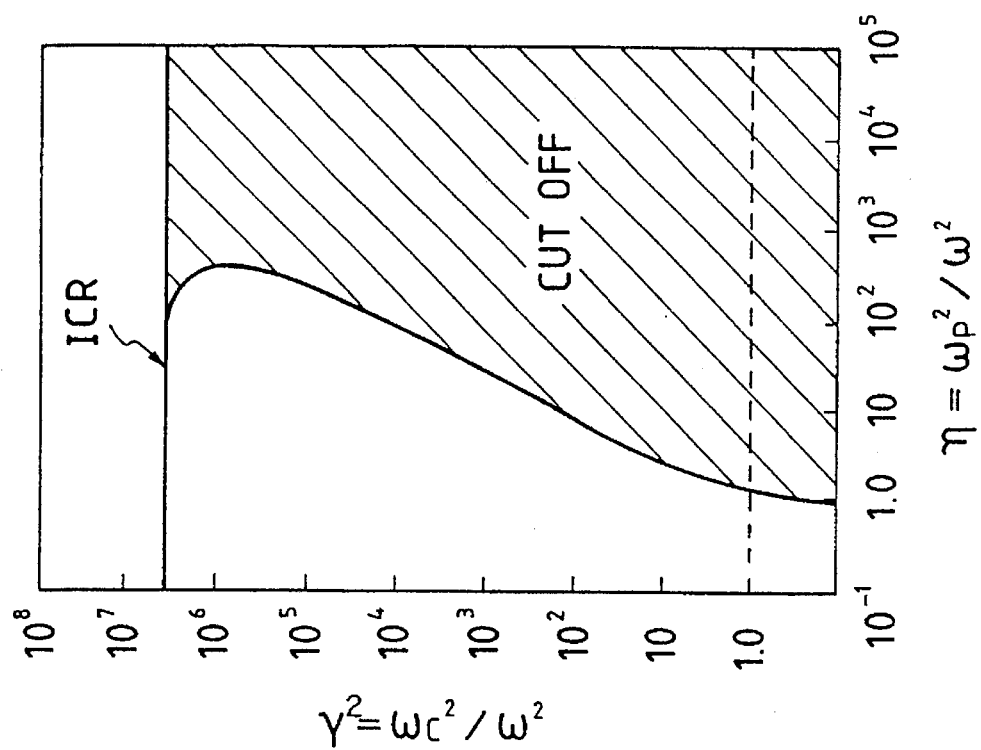
FIGS. 12 (a) and 12 (b) are graphs used in explaining the behavior of an electromagnetic wave in a plasma produced in a static magnetic field.
Figure 12A:
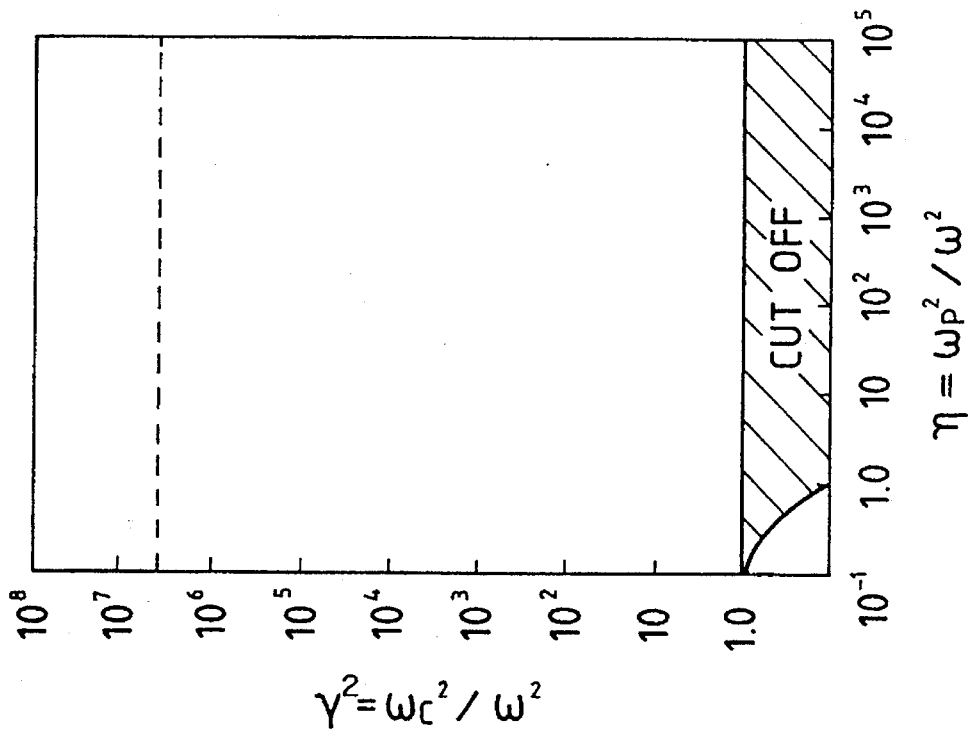

FIG. 11 shows an automatic substrate processing apparatus provided with a plurality of plasma processing apparatuses 34 (two plasma processing apparatuses are shown in FIG. 11) in accordance with the present invention. The plasma processing apparatuses 34 are connected through gate valves 11 to a transfer chamber 33. A transfer mechanism 32 is disposed in the transfer chamber 33. A load-lock chamber 30, through which a substrate is transferred from an atmospheric environment to a vacuum environment, and an unload chamber 31, through which a processed substrate is transferred from the vacuum environment to the atmospheric environment, are connected through gate valves 11 to the transfer chamber 33. The automatic substrate processing apparatus is capable of automatically subjecting a substrate sequentially to different plasma processes or of automatically and simultaneously subjecting a plurality of substrates to the same plasma process. The number of plasma processing apparatuses 34 is optional.

Although the plasma processing apparatuses embodying the present invention have been described as being used for dry etching, the plasma processing apparatuses are applicable to any dry processes using a plasma, such as a resist ashing process using oxygen gas, a plasma cleaning process for removing an oxide film and metallic contaminants from the surface of a substrate before forming a thin film over the surface of the substrate, and a plasma CVD process for depositing a thin film by activating reactive gases with a plasma. When the plasma processing apparatuses are applied to a plasma CVD process, the cooling system 3 for cooling the substrate 2 mounted on the electrode stage 7 must be replaced with a heating system.

The plasma processing apparatuses provided respectively with different types of processing chambers may be used in combination to carry out a dry etching process and an ashing process successively or to carry out a dry etching process, an ashing process and a plasma CVD process successively. The plasma processing method of the present invention for plasma cleaning or plasma ashing may be used in combination with a CVD process or a sputtering process for forming a thin film to clean the surface of the substrate before subjecting the substrate to the CVD process or the sputtering process. In such a case, the surface of the substrate can be cleaned without being damaged to enable a thin film of a high quality to be formed on the substrate.

According to the present invention, a high-density, stable plasma can be used for plasma processing, the jump and transition of the a density of the plasma can be prevented, no electromagnetic field perpendicular to the static magnetic field is created, and the plasma can be produced by an electromagnetic wave of a single mode. Thus, the present invention is capable of quickly processing a substrate for plasma processing without damaging the substrate. The present invention is capable of controlling the amount and energy of ions incident on the surface of the substrate by producing a high-density plasma in a low-pressure region and continuously varying the density of the plasma so that the density of the plasma is optimum for processing the substrate. The field intensity of the static magnetic field employed in the present invention may be not greater than half the field intensity of the static magnetic field employed in the conventional plasma processing apparatus whether the ECR state is to be established or not. Consequently, the plasma can easily and uniformly diffuse over the surface of the substrate and high-frequency power can be uniformly applied to the substrate, so that the substrate can be quickly and uniformly plasma-processed without being damaged by the plasma even if the substrate has a large area.

What is claimed is:

1. A plasma processing method for processing a thin film formed on a substrate or forming a thin film on a substrate within a vacuum vessel, said plasma processing method comprising the steps of:

supplying a gas into the vacuum vessel;

producing a plasma in the vacuum vessel by applying a microwave at a frequency higher than 2.45 GHz to the gas; and creating a static magnetic field represented by magnetic lines of force parallel to the direction of propagation of the microwave in the vacuum vessel using a magnetic circuit, the field intensity of the static magnetic field being lower than a field intensity at which electron cyclotron resonance occurs in combination with the frequency of the microwave.

2. A plasma processing method according to claim 1, wherein said microwave at a frequency higher than 2.45 GHz is a left-hand circularly polarized wave.

3. A plasma processing method according to claim 1, wherein said microwave at a frequency higher than 2.45 GHz is at a frequency not lower than 4.9 GHz.

4. A plasma processing method according to claim 1, wherein a plasma process to be carried out by the plasma processing method is a dry etching process.

5. A plasma processing method according to claim 1, wherein a plasma process to be carried out by the plasma processing method is an ashing process.

6. A plasma processing method according to claim 1, wherein a plasma process to be carried out by the plasma processing method is a plasma CVD process.

7. A plasma processing apparatus comprising:

a vacuum vessel defining a vacuum chamber;

an evacuating device connected to the vacuum vessel;

a gas supply connected to the vacuum vessel to supply a plasma-processing gas into the vacuum chamber;

a substrate support electrode stage disposed within the vacuum vessel;

a microwave source disposed opposite to the electrode stage and supplying a microwave at a frequency higher than 2.45 GHz to said vacuum chamber; and a magnetic circuit generating a static magnetic field represented by magnetic lines of force parallel to the direction of propagation of the microwave in the vacuum vessel, the field intensity of the static magnetic field being lower than a field intensity at which electron cyclotron resonance occurs in a plasma in the vacuum chamber in combination with the frequency of the microwave supplied to said vacuum chamber.

8. A plasma processing apparatus according to claim 7, wherein said microwave at a frequency higher than 2.45 GHz is a left-hand circularly polarized wave.

9. A plasma processing method according to claim 7, wherein said microwave at a frequency higher than 2.45 GHz is at a frequency not lower than 4.9 GHz.

10. A plasma processing apparatus according to claim 7, wherein the substrate support electrode stage is provided with a high-frequency power supply.

11. A plasma processing apparatus according to claim 7, wherein the substrate support electrode stage is provided with an electrostatic attraction device for electrostatically attracting a wafer to the electrode stage, a gas supply for supplying a gas in a space between the backside of a substrate supported on the substrate support electrode stage and the surface of the substrate support electrode stage, and a temperature control for controlling the temperature of the substrate support electrode stage.

12. A plasma processing apparatus according to claim 7, wherein a plasma processing process to be carried out is a dry etching process.

13. A plasma processing apparatus according to claim 7, wherein a plasma processing process to be carried out is an ashing process.

14. A plasma processing apparatus according to claim 7, wherein a plasma processing process to be carried out is a plasma CVD process.

15. A plasma processing method for processing a thin film formed on a substrate or forming a thin film on a substrate within a vacuum vessel, said plasma processing method comprising the steps of:

supplying a gas into the vacuum vessel;

producing a plasma in the vacuum vessel by applying a microwave at a frequency lower than 2.45 GHz to the gas; and creating a static magnetic field represented by magnetic lines of force parallel to the direction of propagation of the microwave in the vacuum vessel using a magnetic circuit, the field intensity of the static magnetic field being not lower than a field intensity at which electron cyclotron resonance occurs in combination with the frequency of the microwave;

wherein the plasma has a density so that a left-hand circularly polarized wave is cut off.

16. A plasma processing method according to claim 15, wherein the frequency of the microwave is in the range of 200 MHz to 1.22 GHz.

17. A plasma processing method according to claim 15, wherein a plasma process to be carried out by the plasma processing method is a dry etching process.

18. A plasma processing method according to claim 15, wherein a plasma process to be carried out by the plasma processing method is an ashing process.

19. A plasma processing method according to claim 15, wherein a plasma process to be carried out by the plasma processing method is a plasma CVD process.

20. A plasma processing apparatus comprising:

a vacuum vessel defining a vacuum chamber;

an evacuating device connected to the vacuum vessel;

a gas supply connected to the vacuum vessel to supply a plasma-processing gas into the vacuum chamber;

a substrate support electrode stage disposed within the vacuum vessel;

a microwave source disposed opposite to the electrode stage and supplying a microwave at a frequency lower than 2.45 GHz to said vacuum chamber; and a magnetic circuit generating a static magnetic field represented by magnetic lines of force parallel to the direction of propagation of the microwave in the vacuum vessel, the field intensity of the static magnetic field being not lower than a field intensity at which electron cyclotron resonance occurs in a plasma in the vacuum chamber in combination with the frequency of the microwave supplied to said vacuum chamber;

wherein the plasma has a density so that a left-hand circularly polarized wave is cut off.

21. A plasma processing apparatus according to claim 20, wherein the frequency of the microwave is in the range of 200 MHz to 1.22 GHz.

22. A plasma processing apparatus according to claim 20, wherein the substrate support electrode stage is provided with a high-frequency power supply.

23. A plasma processing apparatus according to claim 20, wherein the substrate support electrode stage is provided with an electrostatic attraction device for electrostatically attracting a wafer to the electrode stage, a gas supply for supplying a gas in a space between the backside of a substrate supported on the substrate support electrode stage and the surface of the substrate support electrode stage, and a temperature control for controlling the temperature of the substrate support electrode stage.

24. A plasma processing apparatus according to claim 20, wherein a plasma processing process to be carried out is a dry etching process.

25. A plasma processing apparatus according to claim 20, wherein a plasma processing process to be carried out is an ashing process.

26. A plasma processing apparatus according to claim 20, wherein a plasma processing process to be carried out is a plasma CVD process.

* * * * *